(12) United States Patent
Rothman (10) Patent No.: US 10,559,706 B2
(45) Date of Patent: Feb. 11, 2020

(54) AVALANCHE PHOTODIODE TYPE STRUCTURE AND METHOD OF FABRICATING SUCH A STRUCTURE

(71) Applicant: COMMISSARIAT A L 'ENERGIE ATOMIQUE ET AUX ENERGIES ALTERNATIVES, Paris (FR)

(72) Inventor: Johan Rothman, Grenoble (FR)

(73) Assignee: COMMISSARIAT A L'ENERGIE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/643,930

(22) Filed: Jul. 7, 2017

(65) Prior Publication Data

US 2018/0013030 A1    Jan. 11, 2018

(30) Foreign Application Priority Data

Jul. 8, 2016    (FR) ...................... 16 56581

(51) Int. Cl.
*H01L 31/107*    (2006.01)
*H01L 31/0296*   (2006.01)
(Continued)

(52) U.S. Cl.
CPC ...... *H01L 31/107* (2013.01); *H01L 31/02966* (2013.01); *H01L 31/03046* (2013.01); *H01L 31/1832* (2013.01); *H01L 31/1844* (2013.01)

(58) Field of Classification Search
CPC .................................................. H01L 31/107
See application file for complete search history.

(56) References Cited

U.S. PATENT DOCUMENTS 4,326,211 A * 4/1982 Smeets ................. H01L 31/107
                                                    257/438
4,476,346 A * 10/1984 Tawada ............... H01L 31/0392
                                                    136/249
(Continued)

FOREIGN PATENT DOCUMENTS

EP           0448041 A1 * 9/1991 ......... H01L 31/1075

OTHER PUBLICATIONS

U.S. Appl. No. 14/402,020, filed Nov. 18, 2014, 2015/0303320 A1, Francois Boulard et al.

(Continued)

*Primary Examiner* — Thao X Le
*Assistant Examiner* — Laura M Dykes
(74) *Attorney, Agent, or Firm* — Oblon, McClelland, Maier & Neustadt, L.L.P.

(57) ABSTRACT

A structure of the avalanche photodiode type includes a first P doped semiconducting zone, a second multiplication semiconducting zone adapted to supply a multiplication that is preponderant for electrons, a fourth P doped semiconducting "collection" zone. One of the first and second semiconducting zones forms the absorption zone. The structure also includes a third semiconducting zone formed between the second semiconducting zone and the fourth semiconducting zone. The third semiconducting zone has an electric field in operation capable of supplying an acceleration of electrons between the second semiconducting zone and the fourth semiconducting zone without multiplication of carriers by impact ionisation.

20 Claims, 4 Drawing Sheets

(51) Int. Cl.
*H01L 31/0304* (2006.01)
*H01L 31/18* (2006.01)

(56) References Cited

U.S. PATENT DOCUMENTS

| | | | | |
|---|---|---|---|---|
| 5,654,578 | A * | 8/1997 | Watanabe | B82Y 20/00 257/438 |
| 6,326,650 | B1 * | 12/2001 | Allam | H01L 29/155 257/18 |
| 7,936,034 | B2 | 5/2011 | Rothman | |
| 8,232,560 | B2 | 7/2012 | Robin et al. | |
| 8,975,718 | B2 | 3/2015 | Rothman | |
| 9,013,019 | B2 | 4/2015 | Rothman | |
| 9,178,101 | B2 | 11/2015 | Mollard et al. | |
| 9,236,415 | B2 | 1/2016 | Mollard et al. | |
| 9,406,831 | B2 | 8/2016 | Rothman | |
| 9,640,701 | B2 | 5/2017 | Gravrand et al. | |
| 2016/0020241 | A1 * | 1/2016 | Mollard | H01L 27/1443 257/443 |
| 2016/0172525 | A1 | 6/2016 | Huang et al. | |

OTHER PUBLICATIONS

U.S. Appl. No. 15/491,538, filed Apr. 19, 2017, Johan Rothman.
French Preliminary Search Report dated Apr. 27, 2017 in French Application 16 56581 filed on Jul. 8, 2016 (with English Translation of Categories of Cited Documents).
Masahiro Nada et al. "Linearity improvement of high-speed avalanche photodiodes using thin depleted absorber operating with higher order modulation format," Optics Express, vol. 23, No. 21, Aug. 12, 2015, pp. 9.
Ning Duan et al. "High-Speed and Low-Noise SACM Avalanche Photodiodes With an Impact-Ionization-Engineered Multiplication Region," IEEE Photonics Technology Letters, vol. 17, No. 8, Aug. 2005, pp. 3.
Johan Rothman et al. "Response Time Measurements in Short-Wave Infrared HgCdTe e-APDs," Journal of Electronic Materials, 2014, pp. 8.
Gwladys Perrais et al. "Study of the Transit-Time Limitations of the Impulse Response in Mid-Wave Infrared HgCdTe Avalanche Photodiodes" Journal of Electronic Materials, 2009, pp. 10.
Bollen, L.J.M., et al., "The avalanche photodiode", *Philips Technical Review.* Issue 36, No. 7, pp. 205-210, 1976.

* cited by examiner

BACKGROUND ART

AVALANCHE PHOTODIODE TYPE STRUCTURE AND METHOD OF FABRICATING SUCH A STRUCTURE

TECHNICAL DOMAIN

The invention relates to avalanche photodiodes and more precisely to avalanche photodiodes adapted to operate in the hyperfrequencies range.

STATE OF PRIOR ART

The optoelectronics industry is currently searching for avalanche photodiodes capable of receiving an optical signal modulated in the hyperfrequencies range. Avalanche photodiodes usually have a bandwidth that is limited by their response time and therefore they are not suitable for perceiving modulations of optical signals in the hyperfrequencies range.

The expression "modulation in the hyperfrequencies range" as used herein and in the remainder of this document refers to modulations of optical signals with a frequency greater than or equal to 1 GHz, that can vary from 1 GHz to 10 GHz, or even from 1 GHz to 50 GHz, or even from 1 GHz to 100 GHz or even from 1 GHz to 200 GHz.

It is known from the work done by Ning Duan and his co-authors published in the "I.E.E.E Photonics Technology Letters" scientific review volume 17, number 8, pages 1719 to 1721 in 2005, that the bandwidth of avalanche photodiodes can be improved by integrating additional layers upstream and downstream from the absorption layer to accelerate the injection of carriers generated during absorption.

Thus, the photodiode type structure disclosed by Ning Duan that is designed to receive an electromagnetic radiation in a first range of wavelengths, comprises:
- a first P doped upstream zone with a band gap that will make it transparent to the first range of wave lengths (InAlAs layers denoted P+),
- a second semiconducting zone called the absorption zone, also P doped with a lower concentration of carriers than the first zone, the semiconducting material in which said second zone is formed having a band gap width adapted to promote absorption of the electromagnetic radiation (InGaAs layer),
- a third P doped charging zone with a concentration of majority carriers higher than that of the second zone, said third zone comprising a first and a second layer of InAlAs and InGaAlAs respectively,
- a fourth semiconducting zone called the multiplication zone, comprising two layers of InGaAlAs and InAlAs that are not intentionally doped, the third zone also participating in multiplication,
- a fifth semiconducting zone called the collection zone, said fifth zone being N doped.

Thus, this structure is different from a structure of the avalanche photodiode type due to the presence of the first and third zones that generate an electric field to accelerate injection into the multiplication zone of carriers generated in the absorption layer during reception of the electromagnetic radiation.

Such a structure thus has an optimised response time and can significantly increase the bandwidth in comparison with a classical structure because it makes it possible to envisage the use of optical signals modulated at frequencies that can be higher than 10 GHz. Such a structure cannot enable genuinely significant gains, in other words more than 10, for optical signals modulated at frequencies of more than 10 GHz. It will also be noted that such a structure has a variable bandwidth as a function of the gain and therefore that this frequency of 10 GHz can only be reached for relatively small gains, which limits its applications.

Work has also been done on multiplication avalanche photodiode type structures with a given type of carrier, alongside the work done by Ning Duan and his co-authors. The configuration of these structures is such that carriers of only one type (usually electrons) are multiplied during their passages in the multiplication zone. Work done by J. Rothman and his co-authors published in the "Journal of Electronic Materials" volume 43 number 8 pages 2947-2954 in 2014 demonstrated that this selective multiplication of carriers can give a strong gain without any negative influence on the bandwidth. Thus, such structures can be obtained with large bandwidths even for high gains.

However, the bandwidth of these structures with selective multiplication is still too low for hyperfrequency applications. As shown by J. Rothman and his co-authors, at the present time, it is impossible to envisage the use of optical signals modulated at frequencies higher than 10 to 20 GHz with such structures.

PRESENTATION OF THE INVENTION

The invention aims to overcome these disadvantages and thus its purpose is to provide a structure of the avalanche photodiode type capable of receiving optical signals modulated at frequencies in the hyperfrequencies range with a significant gain, so that practical applications become possible in the hyperfrequencies range.

To achieve this, the invention relates to an avalanche photodiode type structure designed to receive an electromagnetic radiation within a first range of wave lengths, the structure comprising:
- a first semiconducting zone of a first type of conductivity with a first face intended to receive the electromagnetic radiation and a second face opposite the first face,
- a second semiconducting zone called the multiplication zone, in contact with the second face of the first semiconducting zone and with a lower concentration of majority carriers than the first semiconducting zone, the second semiconducting zone being conformed to supply a multiplication of carriers by impact ionisation that is preponderant for electrons,
- a fourth semiconducting zone called the collection zone, the fourth semiconducting zone being of a second type of conductivity for which the majority carriers are electrons and having a higher concentration of majority carriers than the second semiconducting zone,
- at least one of the first and second semiconducting zones being formed from a semiconducting material with a suitable band gap width to promote absorption of the electromagnetic radiation, the structure also comprising a third and a fifth semiconducting zone arranged between the second semiconducting zone and the fourth semiconducting zone, the third semiconducting zone having a lower concentration of majority carriers than the first, fourth and fifth semiconducting zones, the fifth semiconducting zone being of the second type of conductivity and having a higher concentration of majority carriers than the second semiconducting zone so as to create an electric field in the third semiconducting zone without multiplication of carriers by impact ionisation.

With such an electric field in the third semiconducting zone, the drift of electrons is much more important in the third zone than it is in the multiplication semiconducting zone, that is highly reduced due to the multiplication of carriers. Such a fast drift of electrons in the third semiconducting zone allows to accelerate the separation of charges in the junction and consequently the evacuation of charges and the supply of an electronic response dominated by the contribution of electrons. However, since the velocity of this contribution of electrons is a factor of at least 3 more than the velocity of the holes, the increase in the bandwidth of the structure compared with prior art is significant. Furthermore, this increased bandwidth is not degraded by a large gain in multiplication, because the multiplication zone of the structure is adapted such that the multiplication of carriers by impact ionisation is preponderant for electrons.

Therefore such a structure makes it possible to envisage hyperfrequency applications due to its optimised response time, even for high gains.

In the above and in the remainder of this document, the expression "multiplication of carriers by impact ionisation that is preponderant for a carrier type" means that the multiplication of carriers by impact ionisation is negligible for one type of carrier compared with the multiplication of carriers by impact ionisation for the other type of carrier, in other words the ratio between the two multiplication ratios is greater than 10, preferably greater than 100, and even more preferably greater than 1000.

Obviously, in the above and in the remainder of this document, the structure is considered to be in operation when its polarisation is within a nominal working voltage range, such as a polarisation between 5 V and 15 V, or between 11 V and 13 V.

The second semiconducting zone can be formed in the semiconducting material that has a band gap width adapted to promote absorption of the electromagnetic radiation.

With such a configuration, the response time and therefore the bandwidth of the structure are particularly well optimised since absorption and multiplication of carriers take place in the same semiconducting zone.

The first semiconducting zone can be formed in the semiconducting material that has a band gap width adapted to promote absorption of the electromagnetic radiation.

The multiplication noise of such a structure is contained because the absorption of photons and the multiplication of carriers are separated, while it is also capable of receiving modulations at frequencies within the hyperfrequencies range, since it benefits from advantages related to the invention.

The fifth semiconducting zone can have a concentration of majority carriers adapted such that the fifth semiconducting zone is depleted during operation of the structure.

In this way, a sufficient electric field can be generated in the third semiconducting zone to optimise the drift of electrons, with a relatively small thickness of the fifth semiconducting zone. The response time of the structure can thus be only slightly influenced or not influenced at all by the presence of the fifth semiconducting zone.

In the above and in the remainder of this document, the expression "depleted semiconducting zone" means a zone from which these carriers have been emptied due to the electric field present in the structure, such depleted semiconducting zones using being associated with a space charge zone of the structure.

The third semiconducting zone may be of the second type of conductivity.

The second semiconducting zone may be of the second type of conductivity.

The structure may also comprise a semiconducting junction that extends along a junction plane, the second and the third semiconducting zones each having a thickness in a direction transverse to said junction plane, and the thickness of the third semiconducting zone may be more that the thickness of the second semiconducting zone, the thickness of the third semiconducting zone preferably being more than twice the thickness of the second semiconducting zone.

With such a thickness of the third semiconducting zone, the influence of the optimised drift of electrons throughout the thickness of the third semiconducting zone is significant over the response time of the structure and is sufficient to compensate for the transit time of carriers in the second semiconducting zone.

In the above and in the remainder of this document, the expression "thickness of a semiconducting zone" means the average dimension of a semiconducting zone along a direction approximately transverse to the junction of the structure.

the band gap width of the third semiconducting zone may be less than the band gap width of the semiconducting material with a band gap width adapted to promote absorption of the electromagnetic radiation in which at least one of the first and second semiconducting zones is formed, the third semiconducting zone preferably comprising a band gap width smaller than the band gap width of the first, second, fourth and fifth semiconducting zones.

With a band gap width that is relatively narrow in comparison with the band gap width of the first semiconducting zone, the electron saturation rate in the third semiconducting zone is optimized regarding the one in the first semiconducting zone and in the second semiconducting zone.

The first and second semiconducting zones can be integrated into a semiconducting layer, the semiconducting layer comprising a first face and a second face, a first portion of the semiconducting layer extending from a part of the first face forming the first semiconducting zone, the remainder of the semiconducting layer forming the second semiconducting zone.

The third and fourth semiconducting zones can be integrated into a semiconducting layer, the semiconducting layer comprising a first portion forming the fourth semiconducting zone, and the remainder of the semiconducting layer forming the third semiconducting zone.

Such arrangements of two semiconducting zones in a semiconducting layer can spatially delimit the structure without the need for an etching operation such as the creation of a mesa.

Each of the first to the fifth semiconducting zones can be formed from a corresponding semiconducting layer, the semiconducting zones being brought into contact with each other through the faces of the semiconducting layers from which they are formed.

Such a plane structure has the advantage of being easy to fabricate, since the structure can be fabricated by successive deposition of layers each of which forms semiconducting zones.

At least part of the semiconducting layers forming the first to the fifth semiconducting zones can be spatially delimited by the walls of a mesa.

Such a spatial delimitation by the walls of a mesa can eliminate the risk of crosstalk and also controls active zones of the structure in which noise can be generated.

The invention also relates to a method of manufacturing an avalanche photodiode type structure, the method including the following steps:

supply a first semiconducting zone of a first type of conductivity for which the majority carriers are electrons, and with a first face intended to receive the electromagnetic radiation and a second face opposite the first face, supply a second semiconducting zone called the multiplication zone, the concentration of majority carriers in the second semiconducting zone being less than the concentration in the first semiconducting zone, said second semiconducting zone being adapted to provide a multiplication of carriers by impact ionisation that is preponderant for electrons, the steps to supply the first and second semiconducting zones being done such that the second semiconducting zone is in contact with the second face of the first semiconducting zone, at least either the first or the second semiconducting zone being formed from a semiconducting material with a band gap width adapted to promote absorption of the electromagnetic radiation, supply a third semiconducting zone and a fifth semiconducting zone, supply a fourth semiconducting zone called the collection zone, said fourth semiconducting zone being of a second type of conductivity for which the majority carriers are electrons and that has a higher concentration of majority carriers than the second semiconducting zone, in which the steps to supply the third and the fifth semiconducting zones are done such that the third and the fifth semiconducting zones are located between the second and the fourth semiconducting zones, the third semiconducting zone having a lower concentration of majority carriers than the first, fourth and fifth semiconducting zones, the fifth semiconducting zone being of the second type of conductivity and having a higher concentration of majority carriers than the second semiconducting zone so as to create an electric field in the third semiconducting zone without multiplication of carriers by impact ionisation.

Such a method can be used to fabricate a structure benefiting from advantages related to the invention.

The step to supply the first zone can be done prior to the steps to supply the second, the third, the fourth and the fifth semiconducting zones, the corresponding and successive steps to supply the second, fifth, third and fourth semiconducting zones each consisting of a step in which said zone is formed in contact with the previously formed semiconducting zone, the second semiconducting zone being formed in contact with the first semiconducting zone.

The step to supply the fourth zone can be done prior to the steps to supply the first, second, third and fifth semiconducting zones, the corresponding and successive steps to supply the third, possibly the fifth, second and first semiconducting zones each consisting of a step in which said zone is formed in contact with the previously formed semiconducting zone, the third semiconducting zone being formed in contact with the fourth semiconducting zone.

Such methods can be used for simple fabrication of a structure benefiting from advantages related to the invention

BRIEF DESCRIPTION OF THE DRAWINGS

This invention will be better understood after reading the description of example embodiments given purely for information and that are in no way limitative with reference to the appended drawings on which.

Identical, similar or equivalent parts of the different figures have the same numeric references to facilitate the comparison between the different figures.

The different parts shown on the figures are not necessarily all at the same scale to make the figures more easily understandable.

It must be understood that the different possibilities (variants and embodiments) are not mutually exclusive and that they can be combined with each other.

DETAILED PRESENTATION OF PARTICULAR EMBODIMENTS

Figure 1:
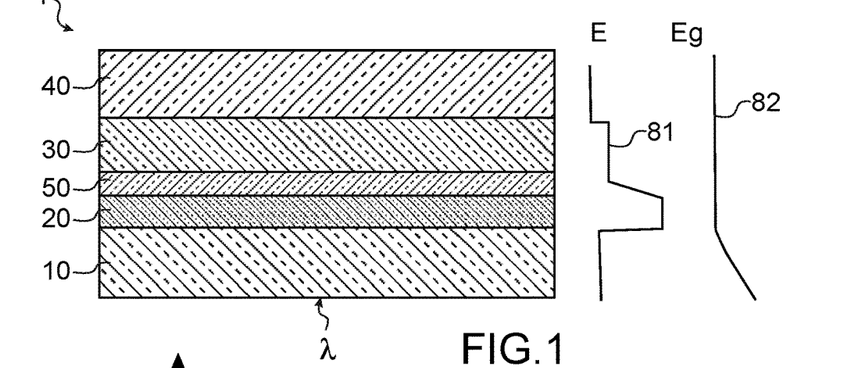
FIG. 1 is a diagrammatic sectional view of a structure according to a first embodiment of the invention in parallel with variations of the electric field and the width of the band gap across its thickness.

FIG. 1 diagrammatically illustrates an avalanche photodiode type structure 1 according to a first embodiment of the invention capable of receiving optical frequencies modulated in the hyperfrequencies range. Such optical signals consist of an electromagnetic radiation in a wave length with a variable intensity at a frequency within the hyperfrequencies range, this variation usually being representative of information to be received.

The invention relates principally to avalanche photodiode type structures for which carrier multiplication by impact ionisation is preponderant for only one type of carrier, namely electrons. The materials chosen in the design of the structures described in the following embodiments are mercury-cadmium tellurides of the $Cd_xHg_{1-x}Te$ type. In such structures, the first type of conductivity is the type of conductivity for which the majority carriers are holes, in other words with P doping, while the second type of conductivity corresponds to the type of conductivity for which the majority carriers are electrons, in other words with N doping.

It can be noted that the terminology "mercury-cadmium telluride" used above and in the remainder of this document should be understood to mean compounds containing tellurium and at least one element chosen from among cadmium and mercury such that the compounds satisfy the formula $Cd_xHg_{1-x}Te$, in which the value x corresponds to the proportion of cadmium relative to mercury and is therefore between 1 and 0, inclusive of 1 and 0.

Nevertheless, the invention is not limited to structures made from mercury-cadmium tellurides and also includes any type of structure designed to obtain preponderant multiplication for only one type of carrier, that is advantageously electrons. Thus; although the different semiconducting zones in the embodiments described in the following are made from mercury-cadmium tellurides, a person skilled in the art would find it easy, using the information disclosed herein, to produce structures according to the invention in which the semiconducting zones are made for example from indium arsenides-antimonides of the $InAs_{1-x}Sb_x$ type.

It can be noted that the terminology "indium arsenide-antimonide" used above and in the remainder of this document should be understood to mean compounds containing indium and at least one element chosen from among arsenic and antimony such that the compounds satisfy the formula $InAs_{1-x}Sb_x$, in which the value x corresponds to the proportion of antimony relative to arsenic and is therefore between 1 and 0, inclusive of 1 and 0.

It will also be understood that although the structure 1 has semiconducting zones made from a single type of material such as mercury cadmium tellurides and indium arsenides-antimonides, it would also be possible to envisage a structure according to the invention with semiconducting zones made of several types of materials, and particularly with the presence of a substrate made from another type of material. Thus for example, a structure with its "functional zones" made of mercury-cadmium tellurides may comprise a support made of zinc-cadmium telluride CdZnTe.

For convenience and for simplification reasons, the first type of conductivity for which the majority carriers are holes is referred to as P doping in the remainder of this document, in accordance with the terminology used by a person skilled in the art. In the same way, the second type of conductivity in which the majority carriers are holes is referred to as N doping in the remainder of this document.

Finally, the embodiments described above are aimed particularly at detection and measurement of an electromagnetic radiation for which the wave length is within the range of wave lengths in the near infrared. Thus, the values and materials mentioned above are particularly applicable for the detection and measurement of the electromagnetic radiation for which the wave length is within the range of wave lengths in the near infrared. Obviously, the values and materials applicable for this application are only given for illustrative purposes and are not limitative. A person skilled in the art would be capable of using the information disclosed herein to adapt the values and/or materials described for applications to other ranges of wave lengths.

In the above and throughout the remainder of this document, the expression "wave lengths in the near infrared" refers to a range of wavelengths between 1.5 µm and 5 µm.

The structure 1 illustrated on FIG. 1 comprises:
  a first P doped semiconducting zone 10, called the absorption zone, with a first face intended to receive the electromagnetic radiation λ and a second face opposite the first face, the semiconducting material in which said first semiconducting zone 10 is formed having a band gap width adapted to facilitate absorption of the electromagnetic radiation
  a second semiconducting zone 20 called the multiplication zone in contact with the second face of the first semiconducting zone 10, the second semiconducting zone 10 being N doped and with a lower concentration of majority carriers than the first semiconducting zone 10, said second semiconducting zone 20 being adapted to supply a multiplication of carriers by impact ionisation that is preponderant for electrons,
  a fifth semiconducting zone 50, called the charging zone, in contact with the second semiconducting zone 20 opposite the first semiconducting zone 10, the fifth zone being N doped and having a higher concentration of majority carriers than the second semiconducting zone 20,
  a third semiconducting zone 30, called the acceleration zone, in contact with the fifth semiconducting zone 50 opposite the second semiconducting zone 20, said third semiconducting zone 30 being N doped and having a lower concentration of majority carriers than the first and fifth semiconducting zones 10, 50, and a similar concentration to the second semiconducting zone 20,
  a fourth semiconducting zone 40 called the collection zone, in contact with the third semiconducting zone 30, said fourth semiconducting zone 40 being of a second type of conductivity opposite the first type of conductivity and having a higher concentration of majority carriers than the second semiconducting zone 20.

Although the second and the third semiconducting zones 20, 30 being of the same type of conductivity in this first embodiment, it could also be envisaged that the second and third semiconducting zones 20, 30 could have opposite types of conductivity. Thus, according to this variant of this first embodiment, the second semiconducting zone 20 has P type doping while the third semiconducting zone has N type doping. Obviously as a variant, and without going outside the framework of the invention, it would also be possible for the second semiconducting zone 20 to have N type doping and the third semiconducting zone to have P type doping, or even for the second and third semiconducting zones 20, 30 to both have P doping.

With such a configuration of the third semiconducting zone, this zone being located between the fifth semiconducting zone and the fourth semiconducting zone and having a concentration of majority carriers lower than the first and the fourth semiconducting zones 10, 40, the third semiconducting zone is configured so that when the structure 1 is in operation, there is an electric field capable of supplying fast drift of electrons between the second and fourth semiconducting zones. In such a configuration, the third semiconducting zone 30 also has a configuration adapted by an appropriate concentration of majority carriers and an appropriate size so that there is no multiplication of carriers by impact ionisation in this third semiconducting zone 30 during operation of the structure 1.

Thus, as shown on FIG. 1, the first semiconducting zone 10 is in the form of a semiconducting layer formed in a mercury-cadmium telluride of the $Cd_xHg_{1-x}Te$ type in which the value x corresponds to the proportion of cadmium relative to mercury, the proportion of cadmium being adapted to correspond to the range of wave lengths and thus be capable of absorption of the electromagnetic radiation.

For example, for wave length ranges corresponding to wave lengths of less than 3.7 µm and 1.8 µm, the proportion x of cadmium can be chosen to be less than or equal to 0.33 and 0.55 respectively for operation at a temperature of 300K.

According to the possibility illustrated on FIG. 1, as shown by the variation of the band gap 82 shown on the right under reference Eg, the width of the band gap can be reduced towards the second semiconducting zone, although it remains sufficient to authorise absorption of the electromagnetic radiation λ in the range of wave lengths even when the width of the band gap is maximum. Thus, according to this possibility and the examples given in the previous section, the proportion of cadmium remains less than or equal to 0.33 and 0.55 for wave length ranges corresponding to wave lengths of less than 3.7 μm and 1.8 μm respectively, throughout the thickness of the first semiconducting zone 1.

The concentration of majority carriers in the first semiconducting zone 10 is preferably between $10^{16}$ and $10^{17}$ $cm^{-3}$. Such a concentration of majority carriers can be supplied by doping elements such as arsenic As, gold Au or antimony Sb, adapted to give at least one hole each when they are activated. The thickness of the layer forming the first semiconducting zone in a direction substantially transverse to the semiconducting junction is between 0.5 and 2 μm.

Note that as a variant of the possibility of varying the width of the band gap in the first semiconducting zone 10, in one embodiment of the invention not illustrated herein, it would be possible for the concentration of majority carriers to vary across the thickness of the first semiconducting zone 10. Obviously, according to another possibility of the invention not illustrated, the first semiconducting zone can have a variation of the cadmium concentration and of majority carriers across its thickness. Such possibilities are particularly advantageous to enable accelerated transfer of the electron in each electron-hole pair generated during absorption of photons from the electromagnetic radiation λ through the first semiconducting zone 10.

The first semiconducting zone 10 has a first and a second face, the first face being intended to receive the electromagnetic radiation λ.

The second semiconducting zone 20 is in the form of a semiconducting layer with a first face and a second face The first face of the second semiconducting zone 20 is in contact with the second face of the first semiconducting zone 10.

The second semiconducting zone 20 is N doped and has a lower concentration of majority carriers than the first semiconducting zone 10. This second semiconducting zone 20 is adapted to supply a multiplication of carriers by impact ionisation that is preponderant or even unique for electrons, during operation of the structure. Such selective multiplication of electrons only is an intrinsic property of mercury-cadmium tellurides of the $Cd_xHg_{1-x}Te$ type in which the value of x corresponds to the proportion of cadmium relative to mercury. Indium arsenides-antimonides of the $InAs_{1-x}Sb_x$ type also have a similar intrinsic property of selective multiplication of electrons only.

It should be noted that according to one variant of the invention, it is also possible to provide such selectivity of multiplication by impact ionisation by a succession of adapted semiconducting zones of materials that do not have such an intrinsic property. This variant covered by the invention is not described in further detail in this document since the purpose of the invention is not to obtain multiplication by selective impact for electrons, and this possibility is known to a person skilled in the art.

The concentration of majority carriers and the thickness of the layer forming the second semiconducting zone 20 are preferably optimised to obtain a maximum gain in the multiplication carriers and a minimum transit time of electrons in the second zone, while having a contained tunnel effect.

To obtain such adaptation, the second semiconducting zone 20 has a concentration of majority carriers that is preferably 10 times less than that of the first semiconducting zone and very advantageously 50 times less Thus, the concentration of majority carriers in the second semiconducting zone can be less than $10^{15}$ $cm^{-3}$, or even $2 \times 10^{14}$ $cm^{-3}$.

The thickness of the second semiconducting zone 20 may be between 0.3 and 2 μm and preferably between 0.4 and 1 μm. As illustrated by the variation of the band gap 82 shown at the right of FIG. 1 as reference Eg, the width of the band gap is preferably chosen to be continuous with the width of the band gap at the second face of the first semiconducting zone 10. Therefore the proportions of cadmium at the interface between the first and second semiconducting zones 10, 20 are identical in these two zones 10, 20.

The fifth semiconducting zone 50 is in the form of a semiconducting layer comprising a first face and a second face. The first face of the fifth semiconducting zone 50 is in contact with the second face of the second semiconducting zone 20.

The fifth semiconducting zone 50 is N doped and has a higher concentration of majority carriers than the second semiconducting zone 20. The concentration of majority carriers in the fifth zone 50 is preferably a factor of 10, and even more preferably a factor of 100, higher than the concentration of majority carriers in the second semiconducting zone 20. Nevertheless, to avoid any disturbance to the operation of the structure 1, it is preferable if the concentration of majority carriers in the fifth semiconducting zone 50 is such that the fifth semiconducting zone is depleted during operation of the structure 1. Such a concentration of majority carriers can be supplied by doping elements such as aluminium Al, indium In or gallium, adapted to give at least one electron each when they are activated. The thickness and the doping level of the fifth semiconducting zone 50 is adapted to supply an electric field as illustrated in FIG. 1 as reference 81, in the semiconducting zone 30 maximising the rate of drift of electrons in the zone 30 without inducing any multiplication in this zone. The thickness of the fifth semiconducting zone 50 is preferably small, in other words less than 0.5 μm, to minimise its contribution to the response time. The thickness of the fifth semiconducting zone 50 is typically less than 0.2 μm, or even less than 0.1 μm.

As illustrated by the variation of the band gap 82 shown at the right of FIG. 1 as reference Eg, the width of the band gap of the fifth semiconducting zone 50 is preferably chosen to be continuous with the width of the band gap of the second semiconducting zone 20. Thus, the proportions of cadmium in the second and fifth semiconducting zones 20, 50 are therefore identical in this first embodiment.

The third semiconducting zone 30 is in the form of a semiconducting layer comprising a first face and a second face. The first face of the third semiconducting zone 30 is in contact with the second face of the fifth semiconducting zone 50.

The third semiconducting zone is N doped. The third semiconducting zone has a lower concentration of majority carriers than the concentration in the first, fourth and fifth semiconducting zones 10, 40, 50 and of the same order as the concentration in the second semiconducting zone 20. Thus, the concentration of majority carriers in the third semiconducting zone can be less than $10^{15}$ $cm^{-3}$, or even $2 \times 10^{14}$ $cm^{-3}$.

According to one advantageous embodiment of the invention, the concentration of majority carriers in the third semiconducting zone 30 is lower than the concentration in the second semiconducting zone 20. Thus, ideally, the concentration of majority carriers in the non-intentionally doped type in the third zone, is of the same order of magnitude as doping of the non-intentionally doped type. This possibility helps to optimise the acceleration of electrons between the second and the fourth semiconducting zones 20, 40 without multiplication by impact ionisation.

The thickness of the third semiconducting zone 30 is preferably more than the thickness of the second semiconducting zone 20. More precisely, the thickness of the third semiconducting zone can preferably be chosen to be a factor of 2 more than the thickness of the second semiconducting zone 20, or even a factor of 3 more than the thickness of the second semiconducting zone 20.

Thus, the thickness of the third semiconducting zone 30 may be between 0.6 and 6 µm and preferably between 0.8 and 3 µm. As illustrated by the variation of the band gap 82 shown at the right of FIG. 1 as reference Eg, the width of the band gap is preferably chosen to be identical to the width of the band gap of the fifth semiconducting zone 50. Therefore the proportions of cadmium in the fifth and third semiconducting zones 50, 30 are identical.

The fourth semiconducting zone 40 is in the form of a semiconducting layer comprising a first face and a second face. The first face of the fourth semiconducting zone 40 is in contact with the second face of the third semiconducting zone 30.

The fourth semiconducting zone 40 is N doped. The concentration of majority carriers in the fourth semiconducting zone 40 is more than $10^{16}$ cm$^{-3}$ that may be of the same order of magnitude or even larger than the concentration in the first semiconducting layer 10. Thus, the concentration of majority carriers in the fourth semiconducting zone may be between $10^{16}$ and $10^{18}$ cm$^{-3}$. The thickness is typically more than 0.5 µm, or even more than 1 µm.

With this structure and an inverse polarisation in an avalanche configuration, an electric field can be created to accelerate electrons between the multiplication layer, in other words the second semiconducting zone 20, and the collection layer, in other words the fourth semiconducting zone 40 so as to optimise the contribution of electrons in comparison to the contribution of holes.

Figure 2A:
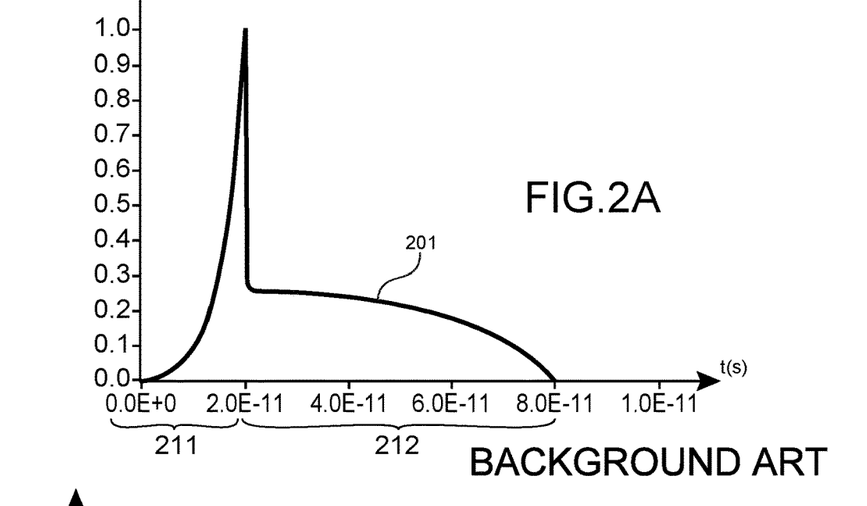
FIGS. 2A and 2B illustrate normalised electronic response curves of a structure according to prior art and of a structure according to the first embodiment of the invention, respectively, FIG. 3 diagrammatically illustrates a practical design of the structure illustrated on FIG. 1 in which the structure is inscribed in a mesa, FIG. 4 diagrammatically illustrates a second practical design of the structure illustrated on FIG. 1 in which the structure is plane.
Figure 2B:
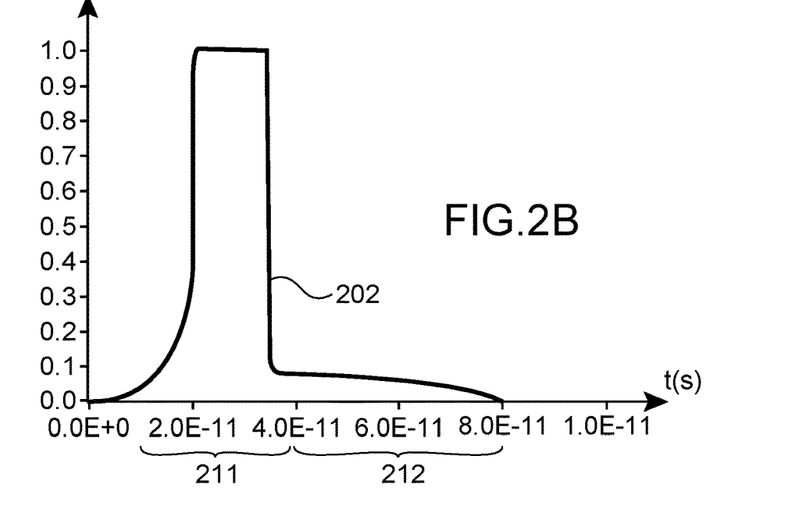

FIGS. 2A and 2B show the expected electronic response times of an optimised structure according to prior art and of a structure according the first embodiment of the invention respectively, so as to illustrate the advantages of such a structure. The response curves thus presented on FIGS. 2A and 2B were obtained using the "pulse response model" described in the article by G. PERRAIS et al. published in the "Journal of Electronic Materials" Volume 38 No 8 pages 1790 to 1799.

The structure according to prior art and the structure according to the first embodiment of the invention for which the response times are illustrated on FIGS. 2A and 2B show absorption, multiplication and collection zones with identical configurations, so that these structures will be comparable.

FIG. 2A graphically illustrates the electronic response curve 201 of an avalanche type structure comprising two additional layers to accelerate the injection of carriers generated during absorption described by Ning Duan and his co-authors. This FIG. 2A shows that the transmitted current has two components 211 and 212, a first component 211 corresponds to the contribution of electrons after the absorption of the electromagnetic radiation λ in the absorption zone, their multiplication in the multiplication zone and their collection, and a second component 212 corresponding to the composition of holes generated in the multiplication layer during the passage of electrons. It can thus be seen in this optimised structure according to prior art that, although electrons can create a fast signal with an average transit rate of electrons in the multiplication layer equal to $3\times10^6$ cm·s$^{-1}$ that is compatible with hyperfrequency applications, their integrated contribution in time is negligible compared with the contribution corresponding to the holes. However the average transit rate of holes is only $1\times10^6$ cm·s$^{-1}$ and the response is perceived over a duration of 60-65 ps, prolonging to 80 ps. Thus, such a structure according to prior art can potentially handle only a bandwidth of up to 9 GHz.

The structure according to the first embodiment of the invention for which the response time is illustrated on FIG. 2B was chosen such that the dimensions of the third semiconducting zone 30 are identical to those in the acceleration layer of the structure according to prior art, so as to supply results comparable to those illustrated on FIG. 2A. The third semiconducting zone 30 is 2 and a half times thicker than the multiplication zone (1.5 µm), its doping is equal to $10^{17}$ cm$^{-3}$ and its drift rate is estimated at $1\times10^7$ cm/s. A higher drift rate in this zone is justified by the lack of any multiplication that tends to reduce it. It can be seen on FIG. 2B that for a structure according to the invention, the transmitted current also has two components 211 and 212, the first corresponding to the contribution of electrons and the second to the contribution of holes. Nevertheless, with a structure according to the invention, the component 211 corresponding to electrons, when it is integrated in time, is preponderant relative to the component 212 corresponding to holes. The fast passage of electrons in the third semiconducting zone 30 initiates an evacuation of charge in this zone that significantly increases the contribution of electrons. Thus, since the electrons component 211 is significantly larger than the holes component, the read circuit associated with the structure will be influenced principally by the contribution of electrons and, as shown on FIG. 2B, the response is perceived over a duration of less than 20 ps, with a response that is prolonged up to 40 ps. Thus, such a structure according to the invention can potentially handle a bandwidth of up to 20 GHz.

Figure 3:
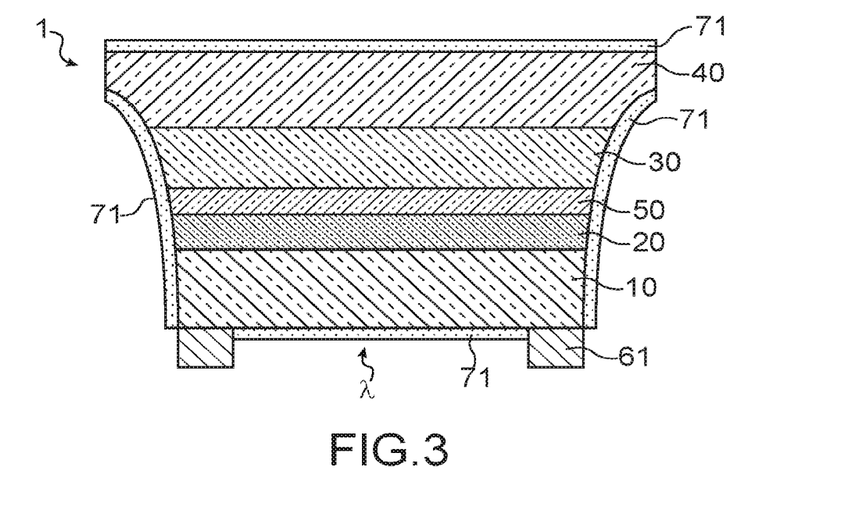

FIG. 3 illustrates a first practical example of a structure 1 according to the invention in a mesa type configuration. Therefore, in addition to the semiconducting zones 10, 20, 30, 40, 50, such a structure comprises:

a mesa type delimitation, the structure 1 having been etched to delimit its active region, a first metallisation 61, a second remote metallisation not being shown on FIG. 3, so as to apply operating voltages of the structure 1 and to recover the signal, the first and the second metallisation 61 being located in contact with the first face of the first semiconducting zone 10, the second metallisation being in resistive contact with the fourth semiconducting zone 40, for example using a via, a passivation layer 71 located on the first face of the first semiconducting zone 10 and the second face of the fourth semiconducting zone 40 so as to protect surface portions not coated by the first and the second metallisations 61, part of the passivation layer also protecting the etching flanks exposed during etching of the structure 1 to form the mesa.

Obviously, according to one variant not illustrated, the first semiconducting zone 10 may be supported by a substrate present opposite the second semiconducting zone 20. According to this variant, the first face of the first semiconducting zone 10 is in contact with the substrate and therefore does not need a passivation layer 71.

The first metallisation 61 and the second remote metallisation are both made from a preferably metallic conducting material, adapted to form a resistive contact with the first and the fourth semiconducting zones 10, 40 respectively.

The first metallisation 61 is preferably configured to occupy a minimum surface area on the first face of the first semiconducting zone 10 to enable optimised penetration of the electromagnetic radiation λ in the first semiconducting zone 10. Thus, for the practical example illustrated on FIG. 3, the first metallisation is arranged around the periphery of the first face of the first semiconducting zone 10. According to another possibility of the invention, the first metallisation can be done at least partially in a conducting material such as indium-tin oxide (ITO) that is transparent to the electromagnetic radiation λ. According to this possibility, the first metallisation 61 can cover a major part of the first face of the first semiconducting zone 10.

The second metallisation can be located on the first face and can be in resistive contact with the fourth semiconducting zone through a metal via formed in a drilling.

The surfaces of semiconducting zones without metallisation are passivated by the passivation layer 71 so as to protect them from chemical, mechanical and/or electrical degradations. Such a passivation layer 71 is preferably composed of an insulating material, for example such as silicon oxide.

Such a structure 1 according to this first practical example according to the invention can be formed by means of a fabrication method comprising the following steps:

supply the first P doped semiconducting zone 10, with a first face intended to receive the electromagnetic radiation λ and a second face opposite the first face, the semiconducting material in which said first semiconducting zone 10 is formed having a band gap width adapted to facilitate absorption of the electromagnetic radiation λ form the second semiconducting zone 20 in contact with the second face of the first semiconducting zone 10, the second semiconducting zone 20 being N doped and having a lower concentration of majority carriers than the first semiconducting zone 10, said second semiconducting zone 20 being adapted to supply a multiplication of carriers by impact ionisation that is preponderant for electrons, form the fifth semiconducting zone 50 in contact with a face of the second semiconducting zone 20 opposite the first semiconducting zone 10, the fifth semiconducting zone being N doped and having a higher concentration of majority carriers than the second semiconducting zone 20, and that is adapted to be depleted during operation of the structure, form the third semiconducting zone 30 in contact with a face of the fifth semiconducting zone 50 opposite the second semiconducting zone 20, the third semiconducting zone 30 being N doped and having a higher concentration of majority carriers than the first and the fifth semiconducting zones 10, 50, said third semiconducting zone 30 being configured to supply an electric field capable of providing an acceleration of electrons between the second and the fourth semiconducting zones 20, 40 without multiplication by impact ionisation, form the fourth semiconducting zone 40 in contact with a face of the third semiconducting zone 30 opposite the fifth semiconducting zone 50, said fourth semiconducting zone 40 being N doped and having a higher concentration of majority carriers than the second and third semiconducting zones 20, 30, partially etch the fourth, third, fifth and second zones 40, 30, 50, 20 so as to reach the first semiconducting zone 10 and to form a mesa, form the first and second metallisations 61 in resistive contact with the first and fourth semiconducting zones, passivate the surfaces of the first and the fourth semiconducting zones 10, 40 without metallisation 61 and on the flanks of the mesa by means of a passivation layer 71.

Steps in the supply and formation of a zone, such as the supply of the first semiconducting zone 10 or the formation of the second semiconducting zone 20 can be done by epitaxial deposition such as molecular beam epitaxy or vapour phase epitaxy. With such methods, in the case in which the structure is composed of mercury-cadmium tellurides, different semiconducting zones can be formed by varying the proportion of cadmium relative to mercury, and the type and concentration of doping elements during the deposition step. Obviously, a step to form a given semiconducting zone results in supplying said semiconducting zone and therefore corresponds to a step to supply this same semiconducting zone.

Obviously, the order of the steps in the fabrication method described above is only given as an example and it is also possible that some steps are performed earlier or later than in the order given.

For example, it will also be realised that such a fabrication method could also include a first step to supply the fourth semiconducting zone 40. In a method according to this possibility, the step to supply the fourth semiconducting zone 40 will be followed by steps to form the third semiconducting zone 30, to form the fifth semiconducting zone 50, to form the second semiconducting zone 20 and to form the first semiconducting zone 10. In the same way, the etching step can then consist of making partial etching of the first, second, fifth and third semiconducting zones 10, 20, 50, 30 so as to reach the fourth semiconducting zone and to form the mesa.

Figure 4:
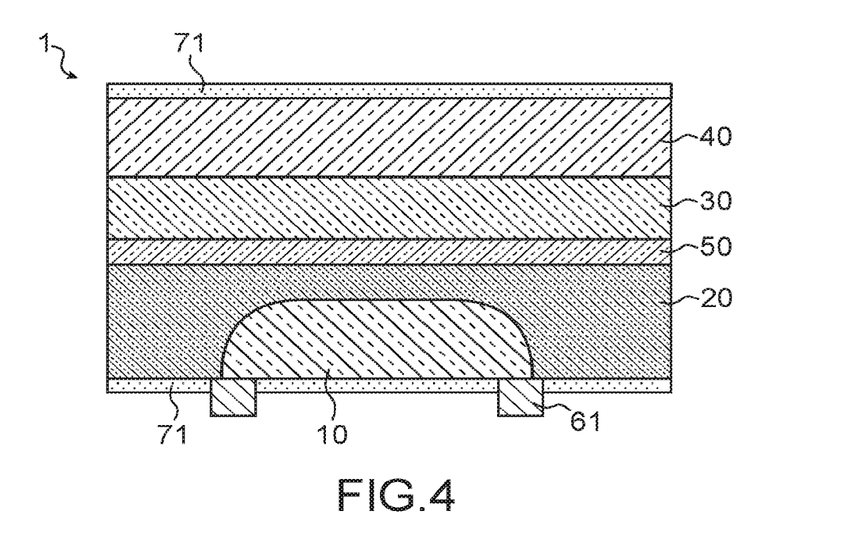

FIG. 4 illustrates a second practical example of a structure 1 according to the first embodiment of the invention in which the structure 1 has a "plane" configuration, the active zone of such a structure 1 being delimited by the shape of the first semiconducting zone 10.

The structure 1 according to this second practical example is different from a structure 1 according to the first embodiment of the invention illustrated on FIG. 1 and the first practical example of the invention, in that the first semiconducting zone 10 is not in the form of a semiconducting layer, and instead is in the form of an overdoped zone inscribed within a semiconducting layer in which the second semiconducting zone 20 is formed.

Thus, according to this second practical example of the first embodiment, the second semiconducting zone 20 and the first semiconducting zone 10 are in the form of a single semiconducting layer in which a first portion forms the first semiconducting zone 10 and the remainder of the layer forms the second semiconducting zone 20. The semiconducting layer forming the first semiconducting zone and the second semiconducting zone 20 has a first face and a second face, the second face corresponding to the face through which the second semiconducting zone is in contact with the fifth semiconducting zone 50. The first portion forming the first semiconducting zone 10 extends from the first face of the semiconducting layer such that a part of the first face of the layer forming the second semiconducting zone 20 forms the first face of the first semiconducting zone 10 intended to receive the electromagnetic radiation.

According to a variant not illustrated and a principle similar to the principle of this second practical example, the third semiconducting zone 30 and the fourth semiconducting zone 40 can be in the form of a single semiconducting layer in which a first portion forms the fourth semiconducting zone 40 and the remainder of the layer forms the third semiconducting zone 30.

Considering the size of such a structure, it will be noted that with the configuration of the first and the second semiconducting zones 10, 20 according to this second practical example, the thicknesses of the first and the second semiconducting zones correspond to the average thickness of the first portion and the thickness of the semiconducting layer minus the average thickness of the first portion, respectively.

A fabrication method according to this second practical example is different from a fabrication method according to the first practical example in that it:

- instead of the steps to supply the second semiconducting zone 20 and to form the first semiconducting zone 10, includes a step to supply a P doped semiconducting layer that will supply the first and the second semiconducting zones 10, 20, the semiconducting layer having the concentration of majority carriers of the second semiconducting zone 20, and a step to implant P type doping elements to form the first semiconducting zone 10,
- does not necessarily include a step to etch a mesa intercepting the zone 10, and
- the passivation step consists of passivating the surfaces without any metallisation on the first face of the semiconducting layer forming the first and the second semiconducting zones 10, 20 and optionally the second face of the fourth semiconducting zone 40.

Obviously, in the same way as for the method of fabricating a structure according to the first practical example described above, the order of the steps is only given as an example and it is also possible that some steps are performed earlier or later than in the order given.

Therefore, it will also be possible to envisage that such a fabrication method could begin with a first step to supply the fourth semiconducting zone 40. Thus, the step to supply the fourth semiconducting zone 40 can then be followed by steps to form the third semiconducting zone 30, to form the fifth semiconducting zone 50, to form the semiconducting layer that will form the second semiconducting zone 20, and to implant the semiconducting layer to form the first semiconducting zone 10 and the second semiconducting zone 20.

According to one variant not illustrated, the fourth semiconducting zone 40 may be supported by a substrate present opposite the third semiconducting zone 30. According to this variant, the second face of the fourth semiconducting zone 40 is in contact with the substrate and therefore does not need a passivation layer 71.

In the same way, in one variant not illustrated, a delimitation of the third semiconducting zone 30 could be provided at a distance, for example by etching a mesa.

Figure 5:
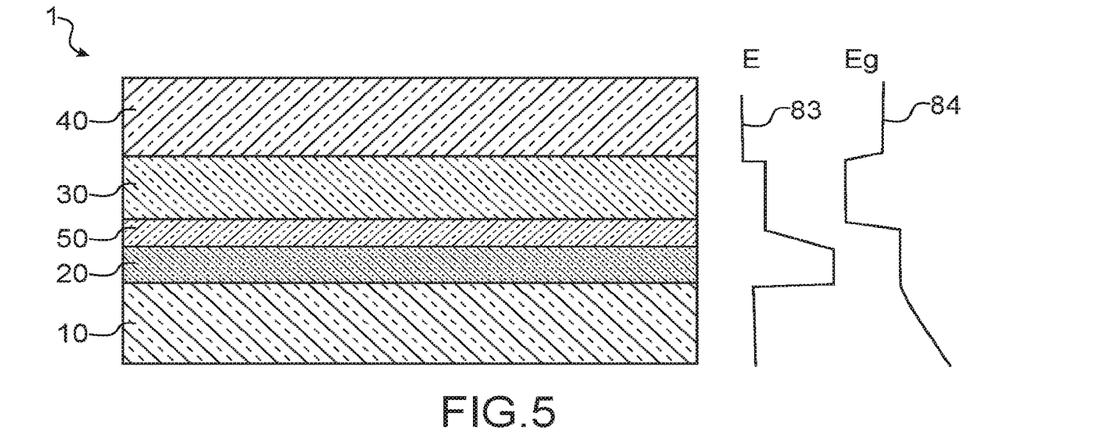
FIG. 5 is a diagrammatic sectional view of a structure according to a second embodiment of the invention in parallel with variations of the electric field and the width of the band gap across its thickness.

FIG. 5 illustrates a structure according to a second embodiment of the invention in which the third zone has a width of low energy band gap. As shown by the variation of the band gap 84 appearing at the right of FIG. 5 as reference Eg, such a structure is only different by the width of the band gap of the third semiconducting zone 30.

In this second embodiment, the width of the band gap of the third semiconducting zone 30 is less than that of the other semiconducting zones 10, 20, 40, 50 so as to have a significantly improved electron saturation rate. For a width of the band gap changing from 0.4 to 0.25 eV, the electron saturation rate in the acceleration layer changes from $1 \times 10^7$ cm·s$^{-1}$ to $3 \times 10^7$ cm·s$^{-1}$. The effect of the electric field 83 generated by the fifth semiconducting zone 50 in the third semiconducting zone 30 is thus optimised.

Figure 6:
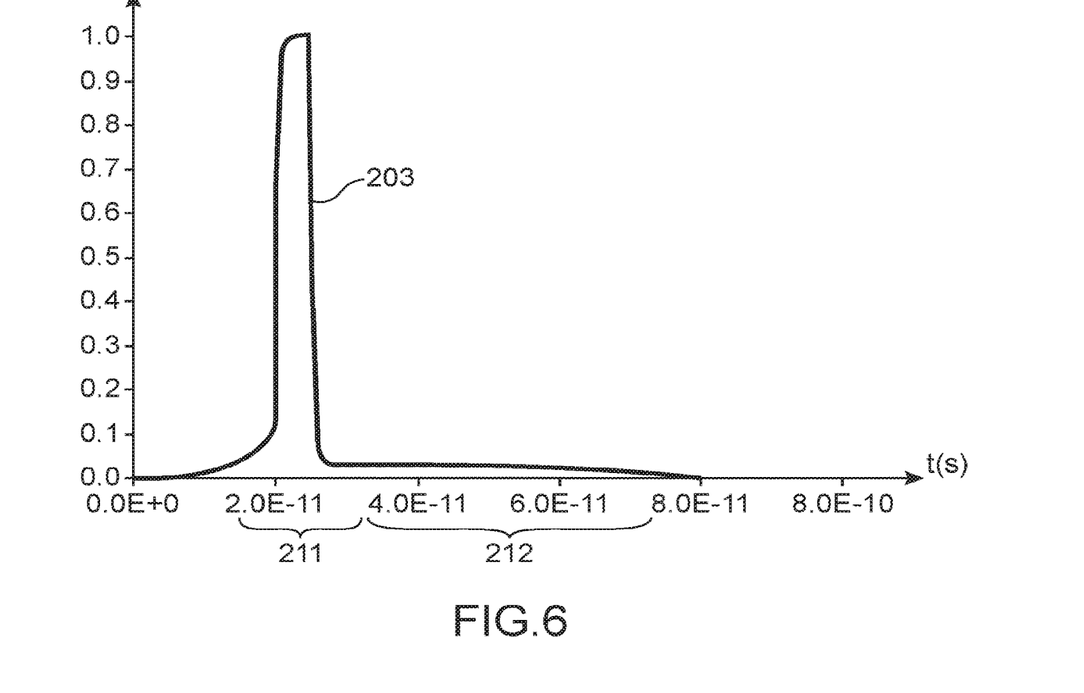
FIG. 6 illustrates the normalised electronic response curve of a structure according to the second embodiment.

Based on a method identical to that used for FIGS. 2A and 2B, FIG. 6 illustrates the expected electronic response time of a structure according to this second embodiment. The configuration of the structure for which the response time is illustrated on FIG. 6 is identical to that of the structure for which the response time is illustrated on FIG. 2B, with the single difference that the band gap of the third semiconducting zone is narrowed, representing a cadmium proportion x equal to 0.3 (Eg~0.25 eV).

It can be seen on FIG. 6 that the response time of the structure is significantly improved. In the same way as for the response time illustrated on FIG. 2B, the electronic contribution 211 is majority regarding the one for holes and is perceived over a duration of 6 ps, the response prolonging to 26 ps. Thus, such a structure according to this second embodiment of the invention can potentially handle a bandwidth of up to 70 GHz.

Figure 7:
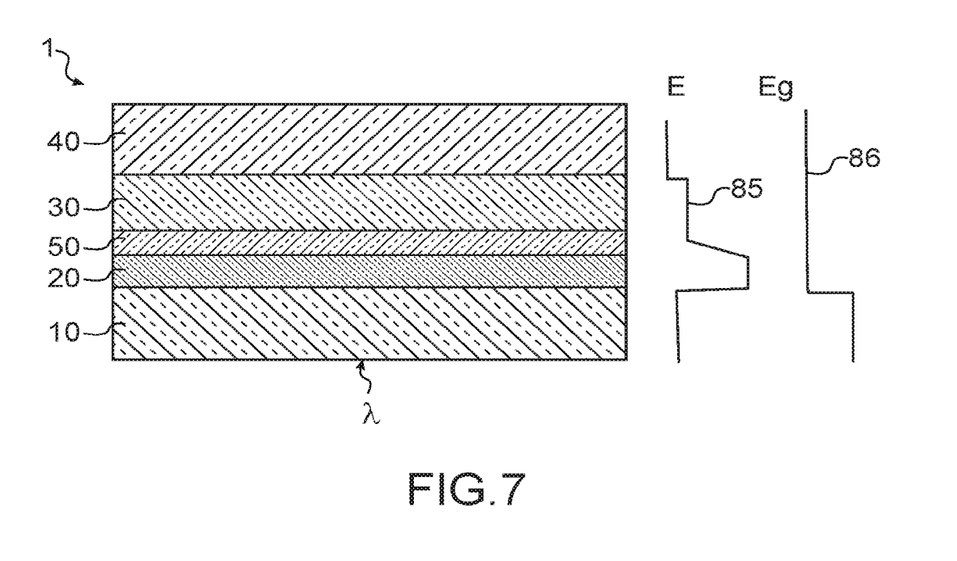
FIG. 7 is a diagrammatic section showing the principle of a structure according to a third embodiment of the invention in which the absorption and multiplication semiconducting zone are coincident.

FIG. 7 illustrates a structure 1 according to a third embodiment of the invention in which the second semiconducting zone 20 simultaneously forms an absorption zone and a multiplication zone. Thus, such a structure 1 is different from a structure 1 according to the first embodiment in that the first semiconducting zone 10 is made from a semiconducting material transparent to the electromagnetic radiation λ and in that the second semiconducting zone 20 is formed from a semiconducting material with an appropriate band gap width to promote absorption of the electromagnetic radiation λ.

In such an embodiment and as illustrated on FIG. 7, the first semiconducting zone 10 is in the form of a semiconducting layer formed in a mercury-cadmium telluride of the $Cd_xHg_{1-x}Te$ type in which the value x corresponds to the proportion of cadmium relative to mercury, the proportion of cadmium being adapted to correspond to the range of wave lengths and thus be transparent to the electromagnetic radiation.

For example, for wave length ranges corresponding to wave lengths of more than 1.4 μm and 1.2 μm, the proportion x of cadmium can be chosen to be greater than 0.66 and 0.75 respectively for operation at a temperature of 300K.

According to the possibility illustrated on FIG. 7, as shown by the band gap 86 appearing on the right as reference Eg, the value of the width of the band gap of the first semiconducting zone 10 is approximately constant. Thus, according to this possibility and the examples given for the first embodiment, the proportion of cadmium is more than 0.66 and 0.75 for wave length ranges corresponding to wave lengths of more than 1.4 μm and 1.2 μm respectively, throughout the thickness of the first semiconducting zone 10.

The second semiconducting zone 20 is in the form of a semiconducting layer formed in a mercury-cadmium telluride of the $Cd_xHg_{1-x}Te$ type in which the value x corresponds to the proportion of cadmium relative to mercury, the proportion of cadmium being adapted to correspond to the range of wave lengths and thus be capable of absorption of the electromagnetic radiation. For wave length ranges corresponding to wave lengths of less than 3.7 μm and 1.8 μm, the proportion x of cadmium can be chosen to be less than or equal to 0.33 and 0.55 respectively for operation at a temperature of 300K.

According to the possibility illustrated on FIG. 7, as shown by the variation of the band gap 86 shown on the right under reference Eg, the width of the band gap is chosen to authorise absorption of the electromagnetic radiation λ in the range of wave lengths. Thus, according to this possibility and the examples given in the previous section, the proportion of cadmium remains less than or equal to 0.33 and 0.55 for wave length ranges corresponding to wave lengths of less than 3.7 µm and 1.8 µm respectively, throughout the thickness of the first semiconducting zone 1.

The only difference between the method of fabricating a structure according to this third embodiment and a method according to the first embodiment is in the composition of the first and second semiconducting zones 10, 20 during steps for the supply of these zones.

A structure 1 according to this third embodiment is particularly advantageous for applications such as telecommunications, in which operating frequencies should be given priority over the signal to noise ratio of the structure. With such a configuration, noise due to multiplication is increased since absorption and multiplication take place in the same semiconducting zone.

Obviously, the practical examples described for this first embodiment are perfectly compatible with this second and this third embodiment, the step to form the third semiconducting zone 30 being adapted such that the band gap width for this third semiconducting zone is less than the band gap width for the other semiconducting zones 10, 20, 40, 50 of the structure 1.

It will also be noted that, as for the first embodiment, as a variant to this second and this third embodiment and without going outside the framework of the invention, it would also be possible for either or both of the second and third semiconducting zones to have P doping instead of N doping.

The invention claimed is:

1. An avalanche photodiode type structure designed to receive an electromagnetic radiation within a first range of wave lengths, the structure comprising:
    a first semiconducting zone of a first type of conductivity for which majority carriers are holes, and with a first face intended to receive the electromagnetic radiation and a second face opposite the first face, the first semiconducting zone forming an absorption zone for absorbing the electromagnetic radiation,
    a second semiconducting zone, called a multiplication zone, in contact with the second face of the first semiconducting zone and with a lower concentration of majority carriers than the first semiconducting zone, the second semiconducting zone being conformed to supply a multiplication of carriers by impact ionization that is preponderant for electrons,
    a fourth semiconducting zone called a collection zone, the fourth semiconducting zone being of a second type of conductivity for which majority carriers are electrons, the fourth semiconducting zone having a higher concentration of majority carriers than the second semiconducting zone,
    wherein at least one of the first and second semiconducting zones being formed from a semiconducting material with a suitable band gap width to promote absorption of the electromagnetic radiation,
    wherein the structure comprises a third and a fifth semiconducting zone arranged between the second semiconducting zone and the fourth semiconducting zone, the third semiconducting zone having a lower concentration of majority carriers than the first semiconducting zone, the fourth semiconducting zone and the fifth semiconducting zone, the fifth semiconducting zone being of the second type of conductivity and having a higher concentration of majority carriers than the second semiconducting zone so as to create an electric field in the third semiconducting zone without multiplication of carriers by impact ionization,
    wherein the third semiconducting zone is arranged between the fifth semiconducting zone and the fourth semiconducting zone, the fifth semiconducting zone being in contact with the second semiconducting zone,
    wherein the third semiconducting zone has a lower concentration of majority carriers than the second semiconducting zone.

2. The avalanche photodiode type structure according to claim 1, wherein the second semiconducting zone is formed in the semiconducting material that has a band gap width adapted to promote absorption of the electromagnetic radiation.

3. The avalanche photodiode type structure according to claim 1, wherein the first semiconducting zone is formed in the semiconducting material that has a band gap width adapted to promote absorption of the electromagnetic radiation.

4. The avalanche photodiode type structure according to claim 1, wherein the fifth semiconducting zone has a concentration of majority carriers adapted so that the fifth semiconducting zone is depleted during operation of the avalanche photodiode type structure.

5. The avalanche photodiode type structure according to claim 1, wherein the third semiconducting zone is of the second type of conductivity.

6. The avalanche photodiode type structure according to claim 1, wherein the second semiconducting zone is of the second type of conductivity.

7. The avalanche photodiode type structure according to claim 1, further comprising a semiconducting junction that extends along a junction plane, the second and the third semiconducting zones each having a thickness in a direction transverse to said junction plane, and
    wherein the thickness of the third semiconducting zone is more than the thickness of the second semiconducting zone.

8. The avalanche photodiode type structure according to claim 1, comprising a semiconducting junction that extends along a junction plane, the second and the third semiconducting zones each having a thickness in a direction transverse to said junction plane, and
    wherein the thickness of the third semiconducting zone is more than twice times the thickness of the second semiconducting zone.

9. The avalanche photodiode type structure according to claim 1, wherein the third semiconducting zone having a band gap width,
    wherein the band gap width of the third semiconducting zone is less than the band gap width of the semiconducting material with a band gap width suitable to promote absorption of the electromagnetic radiation wherein at least one of the first and second semiconducting zones is formed.

10. The avalanche photodiode type structure according to claim 1, wherein the third semiconducting zone comprises a band gap width smaller than a band gap width of the first semiconducting zone, the third semiconducting zone band gap width being smaller than a band gap width of the second semiconducting zone, the third semiconducting zone band gap width being smaller than a band gap width of the fourth semiconducting zone and the third semiconducting zone band gap width being smaller than a band gap width of the fifth semiconducting zone.

11. The avalanche photodiode type structure according to claim 1, wherein the first and second semiconducting zones are integrated into a semiconducting layer, the semiconducting layer comprising a first face and a second face, a first portion of the semiconducting layer extending from a part of the first face forming the first semiconducting zone, the remainder of the semiconducting layer forming the second semiconducting zone.

12. The avalanche photodiode type structure according to claim 1, wherein the third and fourth semiconducting zones are integrated into a semiconducting layer, the semiconducting layer comprising a first portion forming the fourth semiconducting zone, and the remainder of the semiconducting layer forming the third semiconducting zone.

13. The avalanche photodiode type structure according to claim 1, wherein each of the first to the fifth semiconducting zones is formed from a corresponding semiconducting layer, the first to the fifth semiconducting zones being brought into contact with each other through faces of the semiconducting layers from which they are formed.

14. The avalanche photodiode type structure according to claim 13, wherein at least part of the semiconducting layers forming the first to the fifth semiconducting zones is spatially delimited by walls of a mesa.

15. The avalanche photodiode type structure according to claim 1, further comprising a semiconducting junction that extends along a junction plane, the second and the third semiconducting zones each having a thickness in a direction transverse to said junction plane, and
wherein the thickness of the third semiconducting zone is more than three times the thickness of the second semiconducting zone.

16. The avalanche photodiode type structure according to claim 1, wherein a band gap width of the third semiconducting zone and a band gap width of the fifth semiconducting zone are equal.

17. A method of fabrication of an avalanche photodiode type structure, the method comprising:
supplying a first semiconducting zone of a first type of conductivity for which majority carriers are holes, and with a first face intended to receive an electromagnetic radiation and a second face opposite the first face, the first semiconducting zone forming an absorption zone for absorbing the electromagnetic radiation,
supplying a second semiconducting zone called a multiplication zone, a concentration of majority carriers in the second semiconducting zone being less than a concentration of majority carriers in the first semiconducting zone, the second semiconducting zone being adapted to provide a multiplication of carriers by impact ionization that is preponderant for electrons, the steps to supply the first and second semiconducting zones being done such that the second semiconducting zone is in contact with the second face of the first semiconducting zone, at least either the first or the second semiconducting zone being formed from a semiconducting material with a band gap width adapted to promote absorption of the electromagnetic radiation,
supplying a third semiconducting zone and a fifth semiconducting zone,
supplying a fourth semiconducting zone called a collection zone, the fourth semiconducting zone being of a second type of conductivity for which majority carriers are electrons and having a higher concentration of majority carriers than the second semiconducting zone,
wherein the steps to supply the third and the fifth semiconducting zones are done such that the third and the fifth semiconducting zones are located between the second semiconducting zone and the fourth semiconducting zone, the third semiconducting zone having a lower concentration of majority carriers than that of the first semiconducting zone and those of the fourth semiconducting zone and the fifth semiconducting zone, and wherein the fifth semiconducting zone is of the second type of conductivity and having a higher concentration of majority carriers than that of the second semiconducting zone so as to create an electric field in the third semiconducting zone without multiplication of carriers by impact ionization,
wherein the third semiconducting zone is arranged in direct contact with the fifth semiconducting zone in direct contact with and the fourth semiconducting zone, the fifth semiconducting zone being in contact with the second semiconducting zone,
wherein a band gap width of the third semiconducting zone is less than the band gap width of the semiconducting material with a band gap width suitable to promote absorption of the electromagnetic radiation wherein at least one of the first and second semiconducting zones is formed, and
wherein the third semiconducting zone has a constant band gap.

18. The method of fabrication of an avalanche photodiode type structure according to claim 17, wherein the step to supply the first semiconducting zone is done prior to the steps to supply the second semiconducting zone, the third semiconducting zone, the fourth semiconducting zone and the fifth semiconducting zone,
wherein the steps to supply the second semiconducting zone, the fifth semiconducting zone, the third semiconducting zone and fourth semiconducting zone each include a step wherein the corresponding semiconducting zone is formed in contact with the previously formed semiconducting zone, the second semiconducting being formed in contact with the first semiconducting zone.

19. The method of fabrication of an avalanche photodiode type structure according to claim 17, wherein the step to supply the fourth zone is done prior to the steps to supply the first, second, third and fifth semiconducting zones,
wherein the steps to supply the third semiconducting zone, the fifth semiconducting zone, the second semiconducting zone and the first semiconducting zone each include a step wherein the corresponding semiconducting zone is formed in contact with the previously formed semiconducting zone, the third semiconducting zone being formed in contact with the fourth semiconducting zone.

20. An avalanche photodiode type structure designed to receive an electromagnetic radiation within a first range of wave lengths, the structure comprising:
a first semiconducting zone of a first type of conductivity for which majority carriers are holes, and with a first face intended to receive the electromagnetic radiation and a second face opposite the first face, the first semiconducting zone forming an absorption zone for absorbing the electromagnetic radiation,
a second semiconducting zone, called a multiplication zone, in contact with the second face of the first semiconducting zone and with a lower concentration of majority carriers than the first semiconducting zone, the second semiconducting zone being conformed to supply a multiplication of carriers by impact ionization that is preponderant for electrons, a fifth semiconducting zone in contact with the second semiconducting zone on a face of the second semiconducting zone which is opposite to the first semiconducting zone, the fifth semiconducting zone being of a second type of conductivity and having a higher concentration of majority carriers than the second semiconducting zone, a third semiconducting zone direct in contact with the fifth semiconducting zone on a face of the fifth semiconducting zone which is opposite to the second semiconducting zone, the third semiconducting zone having a lower concentration of majority carriers than the first semiconducting zone and the fifth semiconducting zone, and a fourth semiconducting zone called a collection zone, the fourth semiconducting zone being in direct contact with the third semiconducting zone on a face of the third semiconducting zone which is opposite to the fifth semiconducting zone in such a way that the third and the fifth semiconducting zone being arranged between the second semiconducting zone and the fourth semiconducting zone, the fourth semiconducting zone being of a second type of conductivity for which majority carriers are electrons, the fourth semiconducting zone having a higher concentration of majority carriers than the second semiconducting zone and the third semiconducting zone, wherein at least one of the first and second semiconducting zones being formed from a semiconducting material with a suitable band gap width to promote absorption of the electromagnetic radiation, wherein the fifth semiconducting zone concentration of majority carriers being adapted to create an electric field in the third semiconducting zone without multiplication of carriers by impact ionization, wherein the third semiconducting zone having a band gap width, wherein the band gap width of the third semiconducting zone is less than the band gap width of the semiconducting material wherein at least one of the first and second semiconducting zones is formed, and wherein the third semiconducting zone has a constant band gap.

* * * * *

UNITED STATES PATENT AND TRADEMARK OFFICE
CERTIFICATE OF CORRECTION

PATENT NO. : 10,559,706 B2
APPLICATION NO. : 15/643930
DATED : February 11, 2020
INVENTOR(S) : Johan Rothman It is certified that error appears in the above-identified patent and that said Letters Patent is hereby corrected as shown below:

On the Title Page

Item (73), the Assignee's name is incorrect. Item (73) should read:
-- (73) Assignee: COMMISSARIAT A L'ENERGIE ATOMIQUE ET AUX ENERGIES ALTERNATIVES, Paris (FR) --

Signed and Sealed this
Seventh Day of April, 2020

Andrei Iancu
*Director of the United States Patent and Trademark Office*